(12) United States Patent
Liao et al.

(10) Patent No.: US 11,107,777 B2
(45) Date of Patent: Aug. 31, 2021

(54) SUBSTRATE STRUCTURE AND SEMICONDUCTOR PACKAGE STRUCTURE INCLUDING THE SAME

(71) Applicant: Advanced Semiconductor Engineering, Inc., Kaohsiung (TW)

(72) Inventors: Guo-Cheng Liao, Kaohsiung (TW); Yi Chuan Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/420,079

(22) Filed: May 22, 2019

(65) Prior Publication Data
US 2019/0363056 A1  Nov. 28, 2019

Related U.S. Application Data

(60) Provisional application No. 62/676,247, filed on May 24, 2018.

(51) Int. Cl.
| | | |
|---|---|---|
| H01L 23/00 | (2006.01) | |
| H01L 23/498 | (2006.01) | |
| H01L 23/31 | (2006.01) | |

(52) U.S. Cl.
CPC ........ *H01L 23/562* (2013.01); *H01L 23/3121* (2013.01); *H01L 23/49822* (2013.01); *H01L 23/49838* (2013.01)

(58) Field of Classification Search
None
See application file for complete search history.

(56) References Cited

U.S. PATENT DOCUMENTS

| | | | | |
|---|---|---|---|---|
| 9,991,469 B2 * | 6/2018 | Sano | .................... | H01L 27/3258 |
| 10,373,883 B2 * | 8/2019 | Fang | ................. | H01L 31/02002 |
| 2019/0363056 A1 * | 11/2019 | Liao | ...................... | H01L 23/562 |

* cited by examiner

*Primary Examiner* — Long Pham
(74) *Attorney, Agent, or Firm* — Foley & Lardner LLP

(57) ABSTRACT

A substrate structure includes a substrate body, a bottom circuit layer, a first bottom protection structure and a second bottom protection structure. The substrate body has a top surface and a bottom surface opposite to the top surface. The bottom circuit layer is disposed adjacent to the bottom surface of the substrate body, and includes a plurality of pads. The first bottom protection structure is disposed on the bottom surface of the substrate body, and covers a portion of the bottom circuit layer. The second bottom protection structure is disposed on the bottom surface of the substrate body, and covers a portion of the bottom circuit layer. A second thickness of the second bottom protection structure is greater than a first thickness of the first bottom protection structure.

11 Claims, 9 Drawing Sheets

SUBSTRATE STRUCTURE AND SEMICONDUCTOR PACKAGE STRUCTURE INCLUDING THE SAME

CROSS-REFERENCE TO RELATED APPLICATIONS

This application claims the benefit of and priority to U.S. Provisional Application No. 62/676,247, filed May 24, 2018, the contents of which are incorporated herein by reference in their entirety.

BACKGROUND

1. Field of the Disclosure

The present disclosure relates to a substrate structure and a semiconductor package structure, and to a substrate structure including at least two protection structures, and a semiconductor package structure including the same.

2. Description of the Related Art

In a substrate structure, adjacent pads of a circuit layer disposed on a bottom surface of the substrate structure may be spaced apart with each other, and the gap therebetween may be covered by a solder mask to form a strip structure. Further, the solder mask usually covers a periphery portion of the pad. Thus, the strip portion of the solder mask in the gap protrudes beyond a bottom surface of the pad, and the bottom surface of the substrate structure is not a completely flat plane. During a molding process, the substrate structure may be disposed on a surface of a mold chase. Meanwhile, the strip portion of the solder mask and one end of the substrate structure contact the surface of the mold chase, and the other end of the substrate structure is suspended. When a molding compound enters the mold cavity and contacts and presses an entire top surface of the substrate structure, the substrate structure may crack readily due to the protruded strip portion of the solder mask. Thus, a yield of the molding process may decrease.

SUMMARY

In some embodiments, a substrate structure includes a substrate body, a bottom circuit layer, a first bottom protection structure and a second bottom protection structure. The substrate body has a top surface and a bottom surface opposite to the top surface. The bottom circuit layer is disposed adjacent to the bottom surface of the substrate body, and includes a plurality of pads. The first bottom protection structure is disposed on the bottom surface of the substrate body, and covers a portion of the bottom circuit layer. The second bottom protection structure is disposed on the bottom surface of the substrate body, and covers a portion of the bottom circuit layer. A second thickness of the second bottom protection structure is greater than a first thickness of the first bottom protection structure.

In some embodiments, a substrate structure includes a substrate body, a bottom circuit layer, a bottom protection structure and a plurality of supporting pillars. The substrate body has a top surface and a bottom surface opposite to the top surface. The bottom circuit layer is disposed adjacent to the bottom surface of the substrate body, and includes a plurality of first pads and at least one second pad. An area of the second pad is greater than an area of the first pad. The bottom protection structure is disposed on the bottom surface of the substrate body, and covers a portion of the bottom circuit layer. The supporting pillars are disposed on the bottom surface of the second pad of the bottom circuit layer.

In some embodiments, a semiconductor package structure includes a substrate structure, a semiconductor die and an encapsulant. The substrate structure includes a substrate body, a bottom circuit layer, a first bottom protection structure and a second bottom protection structure. The substrate body has a top surface and a bottom surface opposite to the top surface. The bottom circuit layer is disposed adjacent to the bottom surface of the substrate body, and includes a plurality of pads. The first bottom protection structure is disposed on the bottom surface of the substrate body, and covers a portion of the bottom circuit layer. The first bottom protection structure is disposed substantially under the die bonding area. The second bottom protection structure is disposed on the bottom surface of the substrate body, and covers a portion of the bottom circuit layer. A second thickness of the second bottom protection structure is greater than a first thickness of the first bottom protection structure. The semiconductor die is electrically connected to the top surface of the substrate structure. The encapsulant covers the semiconductor die and the substrate structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
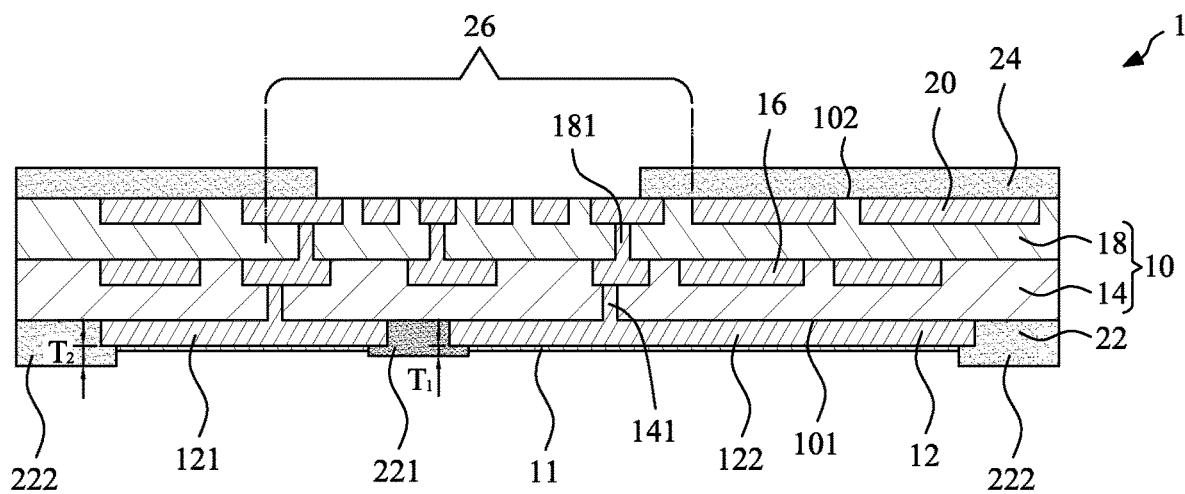
FIG. 1 illustrates a cross-sectional view of a substrate structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a substrate structure, adjacent pads of a circuit layer disposed on a bottom surface of the substrate structure may be spaced apart with each other, and the gap therebetween may be covered by a solder mask to form a strip structure. Further, the solder mask usually covers a periphery portion of the pad. Thus, the strip portion of the solder mask in the gap protrudes beyond a bottom surface of the pad, and the bottom surface of the substrate structure is not a completely flat plane. During a molding process, the substrate structure may be disposed on a surface of a mold chase. Meanwhile, the strip portion of the solder mask and one end of the substrate structure contact the surface of the mold chase, and the other end of the substrate structure is suspended. When a molding compound enters the mold cavity and contacts and presses an entire top surface of the substrate structure, the substrate structure may crack readily due to the protruded strip portion of the solder mask. Thus, a yield of the molding process may decrease.

To address the above concerns, in some comparative embodiments, a pressure of the molding compound is reduced. However, the reduced pressure of the molding compound may cause bleeding of the molding compound, and cannot avoid such crack of the substrate structure completely. In addition, in some comparative embodiments, at least one groove is formed on the surface of the mold chase. However, the cost of such technique is high, and such mold chase can be used for a single type of substrate structure.

At least some embodiments of the present disclosure provide for a substrate structure which includes at least two protection structures disposed adjacent the bottom surface of the substrate structure to cover a bottom circuit layer so as to avoid crack of the substrate structure during a molding process.

Figure 2:
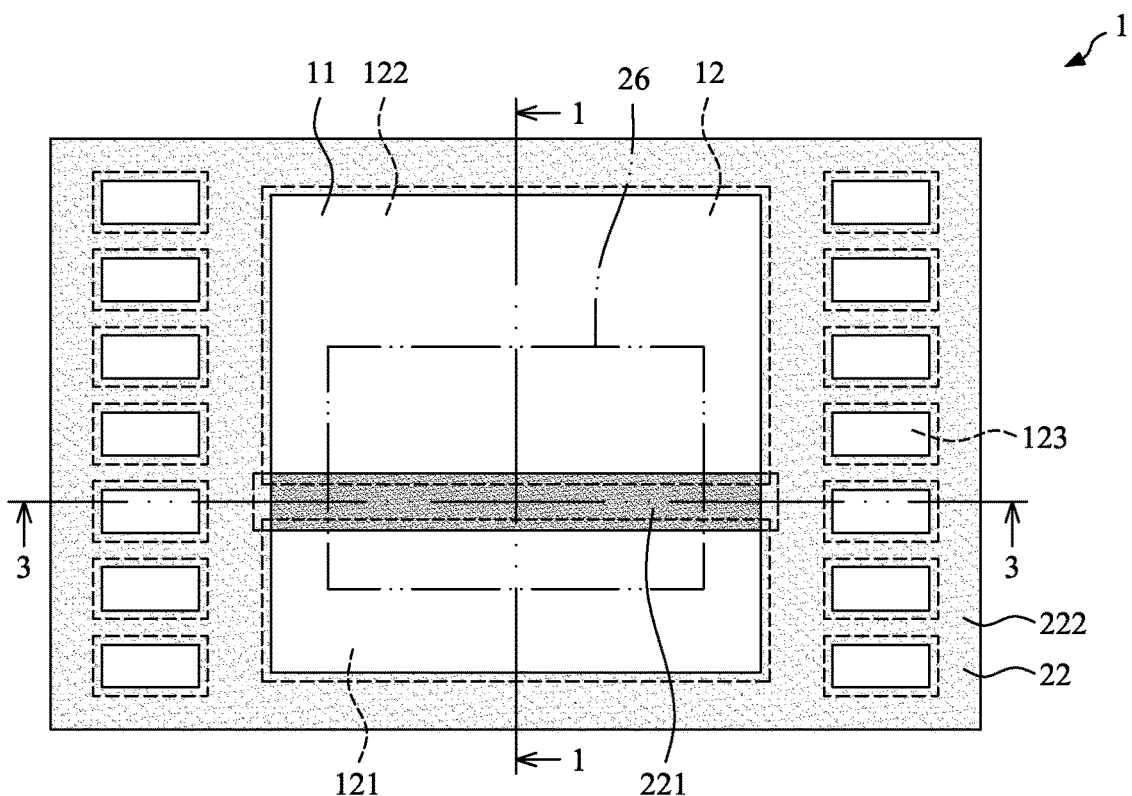
FIG. 2 illustrates a bottom view of the substrate structure of FIG. 1.

FIG. 1 illustrates a cross-sectional view of a substrate structure 1 according to some embodiments of the present disclosure. FIG. 2 illustrates a bottom view of the substrate structure 1 of FIG. 1. It is noted that FIG. 1 is a cross-sectional view of the substrate structure 1 taken along line 1-1 of FIG. 2. The substrate structure 1 may be a coreless substrate structure, and may include a substrate body 10, a bottom circuit layer 12, a surface finish layer 11, a top circuit layer 20, a bottom protection structure 22 (for example, including a first bottom protection structure 221 and a second bottom protection structure 222), a top protection structure 24 and an imaginary die bonding area 26.

The substrate body 10 has a top surface 102 and a bottom surface 101 opposite to the top surface 102, and may include a first dielectric structure 14, a plurality of first conductive vias 141, an intermediate circuit layer 16, a second dielectric structure 18 and a plurality of second conductive vias 181. The first dielectric structure 14 may be a dielectric layer which may be, or may include, for example, a monocrystalline silicon, a polycrystalline silicon, an amorphous silicon, other suitable materials, or a combination thereof. The first dielectric structure 14 may be, or may include, for example, a sheet made from pre-impregnated composite fibers. For example, the first dielectric structure 14 may include a cured fiber reinforced resin. It is noted that the first dielectric structure 14 may include, or be formed from, a cured PID material such as epoxy or polyimide (PI) including photoinitiators. The first dielectric structure 14 has a top surface and a bottom surface opposite to the top surface, and defines a plurality of through holes extending through the first dielectric structure 14. The first conductive vias 141 are disposed in the through holes of the first dielectric structure 14.

The intermediate circuit layer 16 is disposed adjacent to the top surface of the first dielectric structure 14 and includes a plurality of conductive traces and a plurality of pads. The intermediate circuit layer 16 is embedded in the first dielectric structure 14, and a top surface of the intermediate circuit layer 16 may be substantially coplanar with the top surface of the first dielectric structure 14. The intermediate circuit layer 16 may be a patterned circuit layer, and include copper, gold or an alloy thereof.

The second dielectric structure 18 may be a dielectric layer which may be, or may include, for example, a monocrystalline silicon, a polycrystalline silicon, an amorphous silicon, other suitable materials, or a combination thereof. The second dielectric structure 18 may be, or may include, for example, a sheet made from pre-impregnated composite fibers. For example, the second dielectric structure 18 may include a cured fiber reinforced resin. It is noted that the second dielectric structure 18 may include, or be formed from, a cured PID material such as epoxy or polyimide (PI) including photoinitiators. The second dielectric structure 18 covers the first dielectric structure 14 and the intermediate circuit layer 16, and defines a plurality of through holes to expose an upper portion of the pad of the intermediate circuit layer 16. The second conductive vias 181 are disposed in the through holes of the second dielectric structure 18. The second conductive vias 181 and the intermediate circuit layer 16 may be formed concurrently and integrally.

The bottom circuit layer 12 is disposed adjacent to the bottom surface 101 of the substrate body 10 (e.g., the bottom surface of the first dielectric structure 14), and includes a plurality of pads. The bottom circuit layer 12 may be a patterned circuit layer, and include copper, gold or an alloy thereof. As shown in FIG. 1, the bottom circuit layer 12 is disposed on the bottom surface 101 of the substrate body 10, and the bottom circuit layer 12 is electrically connected to the intermediate circuit layer 16 through the first conductive vias 141. For example, the bottom circuit layer 12 and the first conductive vias 141 may be formed concurrently and integrally. In some embodiments, the pads of the bottom circuit layer 12 may include a plurality of first pads (e.g., signal pads 123) and at least one second pad (e.g., at least one power pad 121 and at least one ground pad 122). An area of the second pad (e.g., the power pad 121 and/or the ground pad 122) is greater than an area of the first pad (e.g., signal pad 123) (e.g., may be about 3 or more times greater, about 5 or more times greater, about 10 or more times greater, or about 20 or more times greater). The first pads (e.g., signal pads 123) may be disposed around the second pad (e.g., the power pad 121 and/or the ground pad 122).

The top circuit layer 20 is disposed adjacent to the top surface 102 of the substrate body 10 (e.g., the top surface of the second dielectric structure 18), and includes a plurality of conductive traces and a plurality of pads. The top circuit layer 20 may be a patterned circuit layer, and include copper, gold or an alloy thereof. The top circuit layer 20 is embedded in the second dielectric structure 18, and a top surface of the top circuit layer 20 may be substantially coplanar with the top surface of the second dielectric structure 18. Thus, a portion of the top circuit layer 20 may be exposed from the top surface of the second dielectric structure 18. As shown in FIG. 1, the top circuit layer 20 is electrically connected to the intermediate circuit layer 16 through the second conductive vias 181.

The top protection structure 24 is disposed on the top surface 102 of the substrate body 10, and covers a portion of the top circuit layer 20. A material of the top protection structure 24 may include a solder mask or a solder resist material, such as, for example, benzocyclobutene (BCB) or polyimide. A portion of the top circuit layer 20 may be exposed from an opening of the top protection structure 24.

The bottom protection structure 22 may include a first bottom protection structure 221 and a second bottom protection structure 222. The first bottom protection structure 221 is disposed on the bottom surface 101 of the substrate body 10, and covers a portion of the bottom circuit layer 12. A material of the first bottom protection structure 221 may include a solder mask or a solder resist material, such as, for example, benzocyclobutene (BCB) or polyimide. The first bottom protection structure 221 is disposed between the power pad 121 and the ground pad 122, and covers a portion of the power pad 121 and a portion of the ground pad 122. As shown in FIG. 1, the first bottom protection structure 221 has a first thickness T1 that is defined as a gap between a bottom surface of the first bottom protection structure 221 and a bottom surface of the bottom circuit layer 12.

The second bottom protection structure 222 is disposed on the bottom surface 101 of the substrate body 10, and covers a portion of the bottom circuit layer 12. A material of the second bottom protection structure 222 may include a solder mask or a solder resist material, such as, for example, benzocyclobutene (BCB) or polyimide. The material of the first bottom protection structure 221 is the same as or different from the material of the second bottom protection structure 222. As shown in FIG. 2, the second bottom protection structure 222 is disposed at a periphery of the bottom surface 101 of the substrate body 10. Thus, the first bottom protection structure 221 is disposed within an area enclosed by the second bottom protection structure 222. The second bottom protection structure 222 covers a portion of the power pad 121, a portion of the ground pad 122 and a portion of the signal pad 123. Thus, the power pad 121 and the ground pad 122 are exposed from the first bottom protection structure 221 and the second bottom protection structure 222, and the signal pads 123 are exposed from the second bottom protection structure 222. In some embodiments, the surface finish layer 11 (e.g., Ni/Au layer) is disposed or plated on the exposed power pad 121 (FIG. 1), the exposed ground pad 122 (FIG. 1) and the exposed signal pads 123 (FIG. 3).

As shown in FIG. 1, the second bottom protection structure 222 has a second thickness $T_2$ that is defined as a gap between a bottom surface of the second bottom protection structure 222 and a bottom surface of the bottom circuit layer 12. The second thickness $T_2$ of the second bottom protection structure 222 is greater than the first thickness $T_1$ of the first bottom protection structure 221. In some embodiments, the second thickness $T_2$ of the second bottom protection structure 222 is greater than the first thickness $T_1$ of the first bottom protection structure 221 by more than 5 μm, more than 10 μm, or more than 15 μm. For example, the first thickness $T_1$ of the first bottom protection structure 221 may be in a range of about 1 μm to about 11 μm, and the second thickness $T_2$ of the second bottom protection structure 222 may be in a range of about 15 μm to about 25 μm, or about 10 μm to about 20 μm.

The imaginary die bonding area 26 is an area on which a semiconductor die 28 (FIG. 9) is mounted. As shown in FIG. 1, the imaginary die bonding area 26 is disposed adjacent to the top surface 102 of the substrate body 10, and the first bottom protection structure 221 is disposed substantially under the imaginary die bonding area 26. As shown in FIG. 1, the position of the imaginary die bonding area 26 may correspond to the opening of the top protection structure 24, and the first bottom protection structure 221 is disposed right under the imaginary die bonding area 26.

Figure 3:
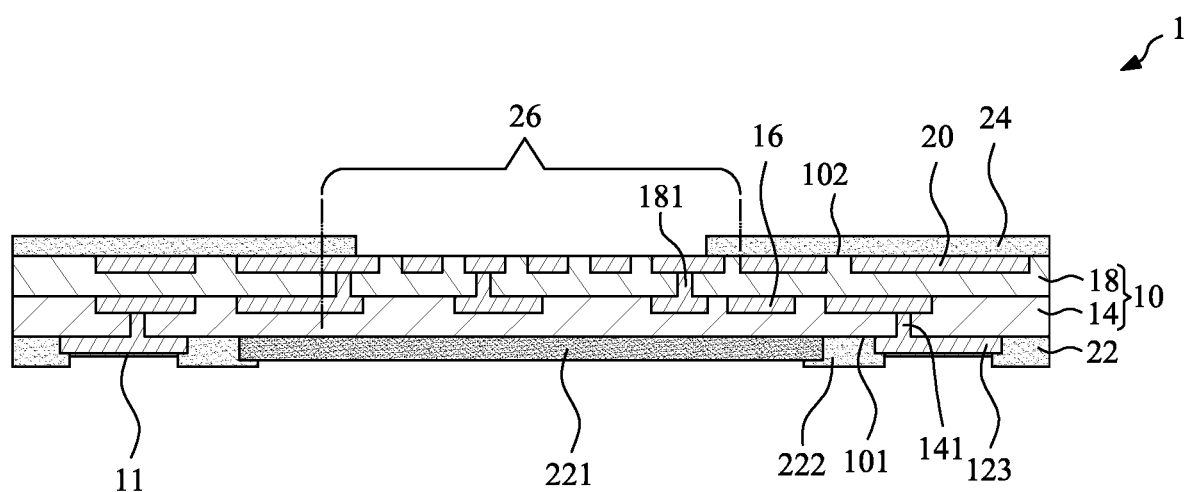
FIG. 3 illustrates a cross-sectional view of the substrate structure taken along line 3-3 of FIG. 2.

FIG. 3 illustrates a cross-sectional view of the substrate structure 1 taken along line 3-3 of FIG. 2. As shown in FIG. 3, the second bottom protection structure 222 covers a portion (e.g. two ends) of the first bottom protection structure 221. Thus, there is a boundary between the second bottom protection structure 222 and the first bottom protection structure 221. The second bottom protection structure 222 and the first bottom protection structure 221 are not formed concurrently and integrally. In some embodiments, a total thickness of the second bottom protection structure 222 is greater than a total thickness of the first bottom protection structure 221.

Figure 4:
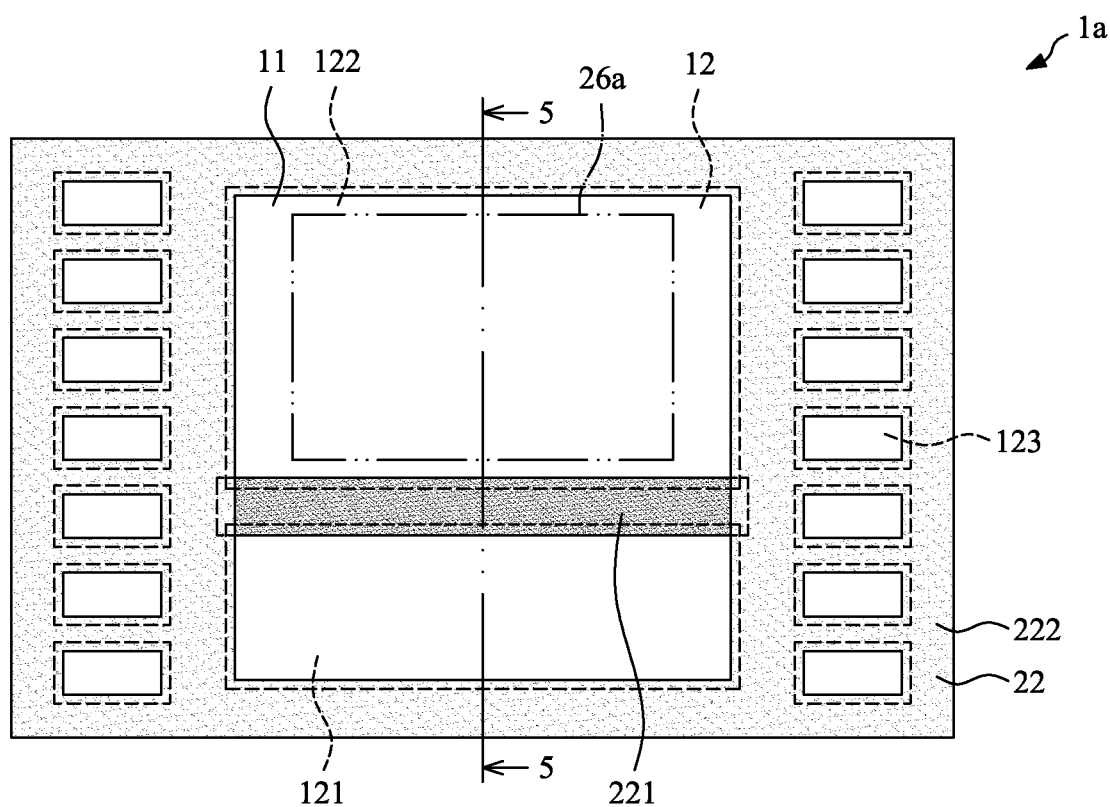
FIG. 4 illustrates a bottom view of a substrate structure according to some embodiments of the present disclosure.
Figure 5:
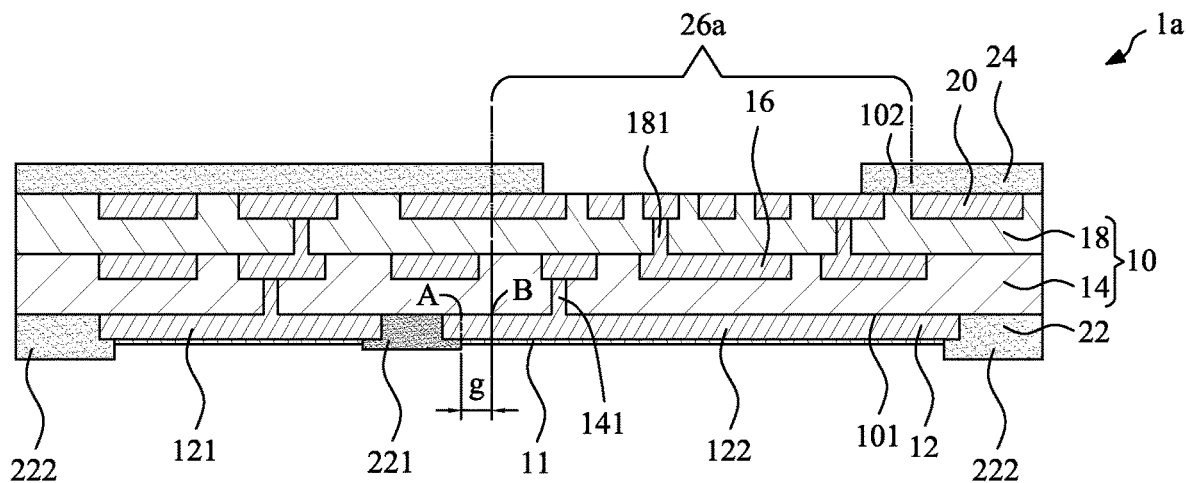
FIG. 5 illustrates a cross-sectional view of the substrate structure taken along line 5-5 of FIG. 4.

FIG. 4 illustrates a bottom view of a substrate structure 1a according to some embodiments of the present disclosure. FIG. 5 illustrates a cross-sectional view of the substrate structure 1a taken along line 5-5 of FIG. 4. The substrate structure 1a of FIG. 4 and FIG. 5 may be similar to the substrate structure 1 of FIG. 1 through FIG. 3 except for the position of the imaginary die bonding area 26a. As shown in FIG. 4 and FIG. 5, the imaginary die bonding area 26a may be disposed right above the ground pad 122. That is, the first bottom protection structure 221 is not disposed right under the imaginary die bonding area 26a. An edge of the imaginary die bonding area 26a projecting on the bottom surface 101 of the substrate body 10 is defined as a point "B". In addition, an edge of the first bottom protection structure 221 projecting on the bottom surface 101 of the substrate body 10 is defined as a point "A". A gap g between the point "B" and the point "A" is less than about 150 µm, about 100 µm or about 50 µm.

Figure 6:
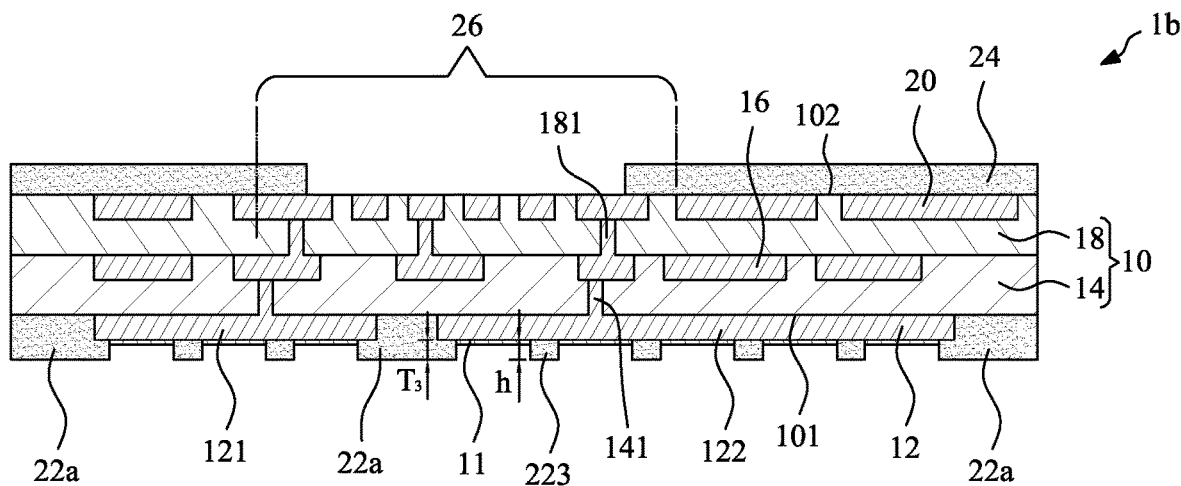
FIG. 6 illustrates a cross-sectional view of a substrate structure according to some embodiments of the present disclosure.
Figure 7:
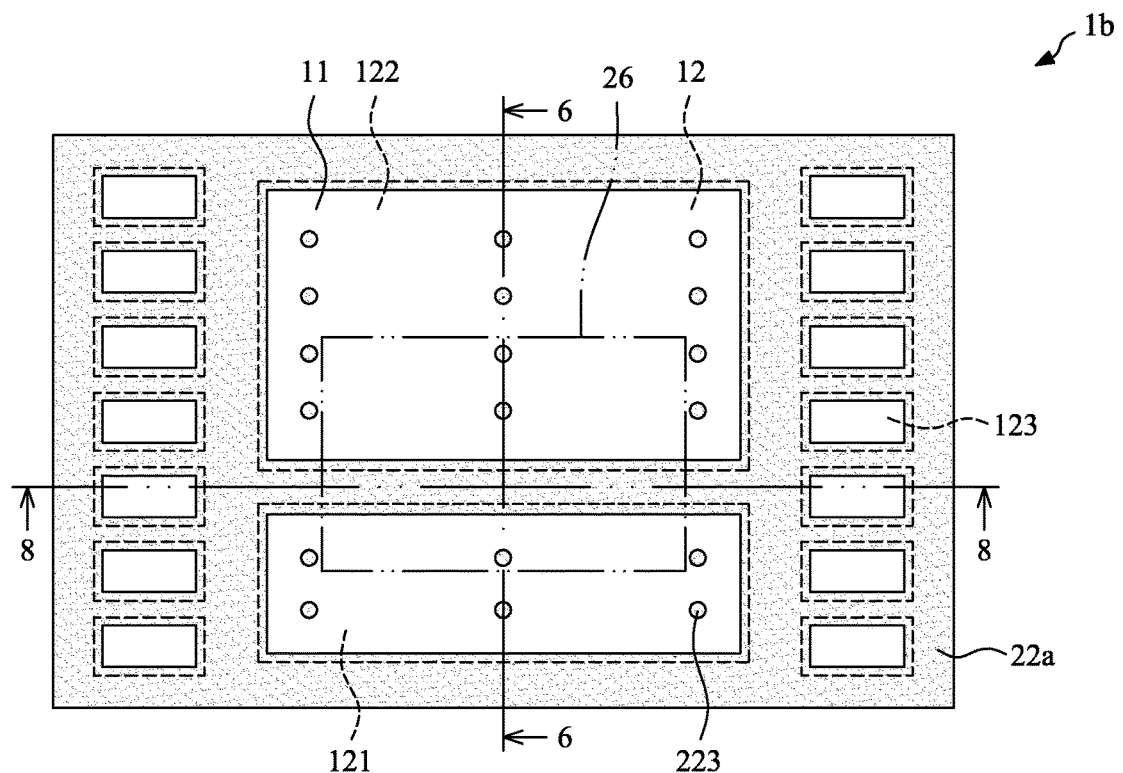
FIG. 7 illustrates a bottom view of the substrate structure of FIG. 6.
Figure 8:
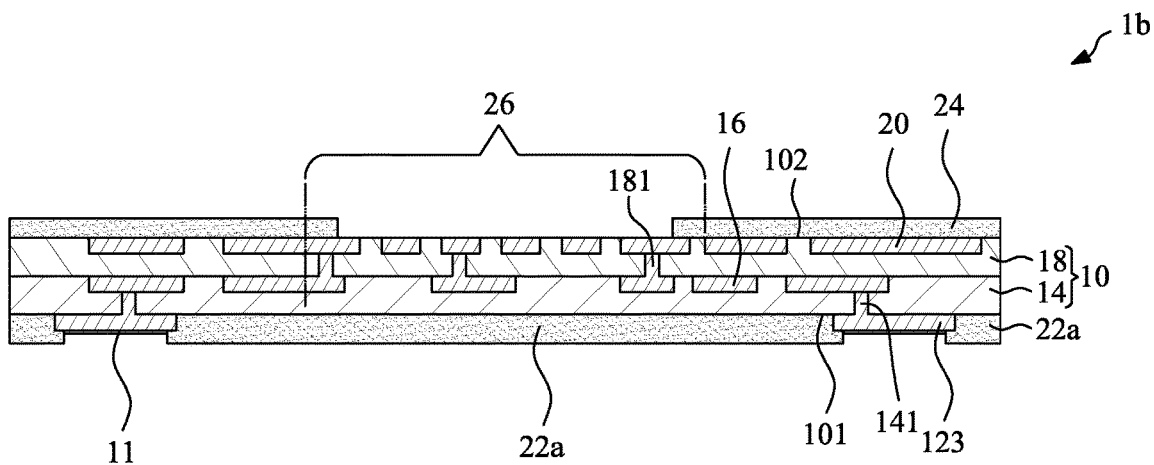
FIG. 8 illustrates a cross-sectional view of the substrate structure taken along line 8-8 of FIG. 7.

FIG. 6 illustrates a cross-sectional view of a substrate structure 1b according to some embodiments of the present disclosure. FIG. 7 illustrates a bottom view of the substrate structure 1b of FIG. 6. It is noted that FIG. 6 is a cross-sectional view of the substrate structure 1b taken along line 6-6 of FIG. 7. FIG. 8 illustrates a cross-sectional view of the substrate structure 1b taken along line 8-8 of FIG. 7. The substrate structure 1b of FIG. 6 through FIG. 8 may be similar to the substrate structure 1 of FIG. 1 through FIG. 3 except for the structure of the bottom protection structure 22a. The bottom protection structure 22a is disposed on the bottom surface 101 of the substrate body 10, and covers a portion of the bottom circuit layer 12. A material of the bottom protection structure 22a may include a solder mask or a solder resist material, such as, for example, benzocyclobutene (BCB) or polyimide. The bottom protection structure 22a is disposed between the power pad 121 and the ground pad 122, and at a periphery of the bottom surface 101 of the substrate body 10. Thus, the bottom protection structure 22a covers a portion of the power pad 121, a portion of the ground pad 122 and a portion of the signal pad 123. As shown in FIG. 6, the bottom protection structure 22a has a third thickness $T_3$ that is defined as a gap between a bottom surface of the bottom protection structure 22a and a bottom surface of the bottom circuit layer 12.

In addition, the substrate structure 1b may further include a plurality of supporting pillars 223 as shown in FIG. 6 and FIG. 7. The supporting pillars 223 are disposed on the bottom surface of the second pad (e.g., the power pad 121 and/or the ground pad 122) of the bottom circuit layer 12. In one embodiment, the supporting pillars 223 are disposed on the power pad 121 and the ground pad 122, and are arranged in an array. Each of the supporting pillars 223 may be a cylinder or other shape. A material of the supporting pillar 223 may include a solder mask or a solder resist material, such as, for example, benzocyclobutene (BCB) or polyimide. The material of the supporting pillars 223 may the same as or different from the material of the bottom protection structure 22a. As shown in FIG. 6, the supporting pillar 223 has a height h that is defined as a distance between a bottom surface of the supporting pillar 223 and a bottom surface of the bottom circuit layer 12. The third thickness $T_3$ of the bottom protection structure 22a is substantially equal to the height h of the supporting pillar 223. Thus, the bottom surface of the bottom protection structure 22a is substantially coplanar with the bottom surface of the supporting pillar 223. In some embodiments, the supporting pillars 223 and the bottom protection structure 22a are formed concurrently at a same stage.

Figure 9:
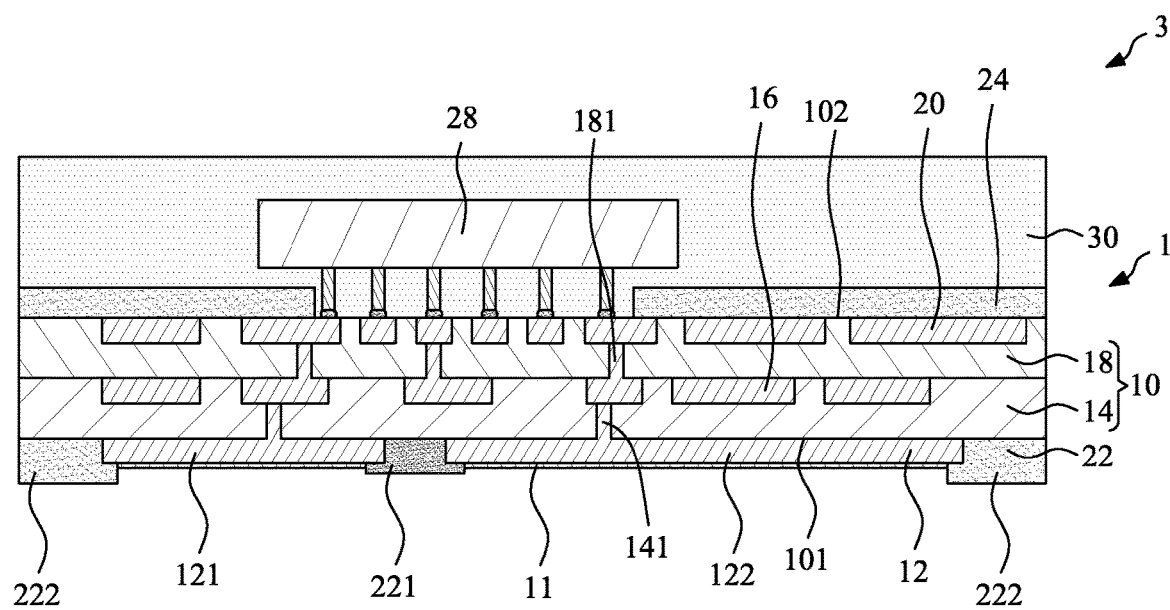
FIG. 9 illustrates a cross-sectional view of a semiconductor package structure according to some embodiments of the present disclosure.

FIG. 9 illustrates a cross-sectional view of a semiconductor package structure 3 according to some embodiments of the present disclosure. The semiconductor package structure 3 includes a substrate structure 1, a semiconductor die 28 and an encapsulant 30. The substrate structure 1 of FIG. 9 is substantially the same as the substrate structure 1 of FIG. 1. The semiconductor die 28 is electrically connected to the top surface of the substrate structure 1 (e.g., the top surface 102 of the substrate body 10). As shown in FIG. 9, the semiconductor die 28 is electrically connected to the top circuit layer 20 by flip chip bonding, and is disposed in the imaginary die bonding area 26. The encapsulant 30, for example, molding compound, covers the semiconductor die 28, the top protection structure 24 of the substrate structure 1 and a portion of the top circuit layer 20 of the substrate structure 1.

Figure 10:
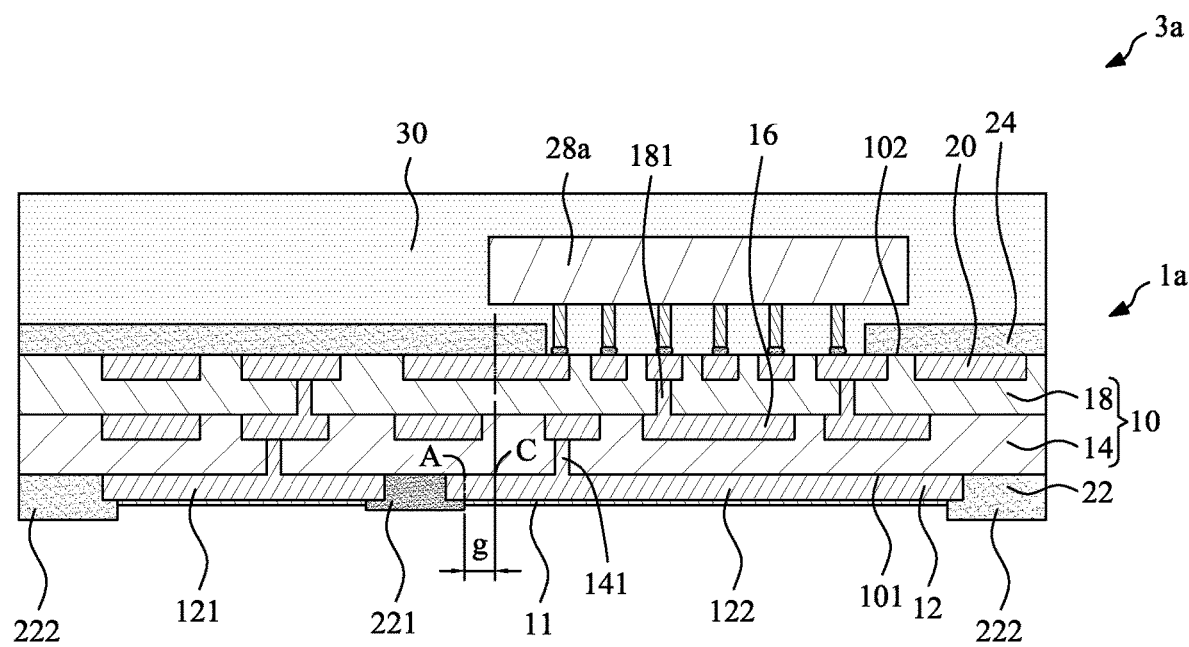
FIG. 10 illustrates a cross-sectional view of a semiconductor package structure according to some embodiments of the present disclosure.

FIG. 10 illustrates a cross-sectional view of a semiconductor package structure 3a according to some embodiments of the present disclosure. The semiconductor package structure 3a includes a substrate structure 1a, a semiconductor die 28a and an encapsulant 30. The substrate structure 1a of FIG. 10 is substantially the same as the substrate structure 1a of FIG. 5. The semiconductor die 28a is electrically connected to the top surface of the substrate structure 1a (e.g., the top surface 102 of the substrate body 10). As shown in FIG. 10, the semiconductor die 28a is electrically connected to the top circuit layer 20 by flip chip bonding, and is disposed in the imaginary die bonding area 26a. An edge of the semiconductor die 28a projecting on the bottom surface 101 of the substrate body 10 is defined as a point "C". In addition, an edge of the first bottom protection structure 221 projecting on the bottom surface 101 of the substrate body 10 is defined as a point "A". A gap g between the point "C" and the point "A" is less than about 150 µm, about 100 µm or about 50 µm. The encapsulant 30, for example, molding compound, covers the semiconductor die 28a, the top protection structure 24 of the substrate structure 1a and a portion of the top circuit layer 20 of the substrate structure 1a.

Figure 11:
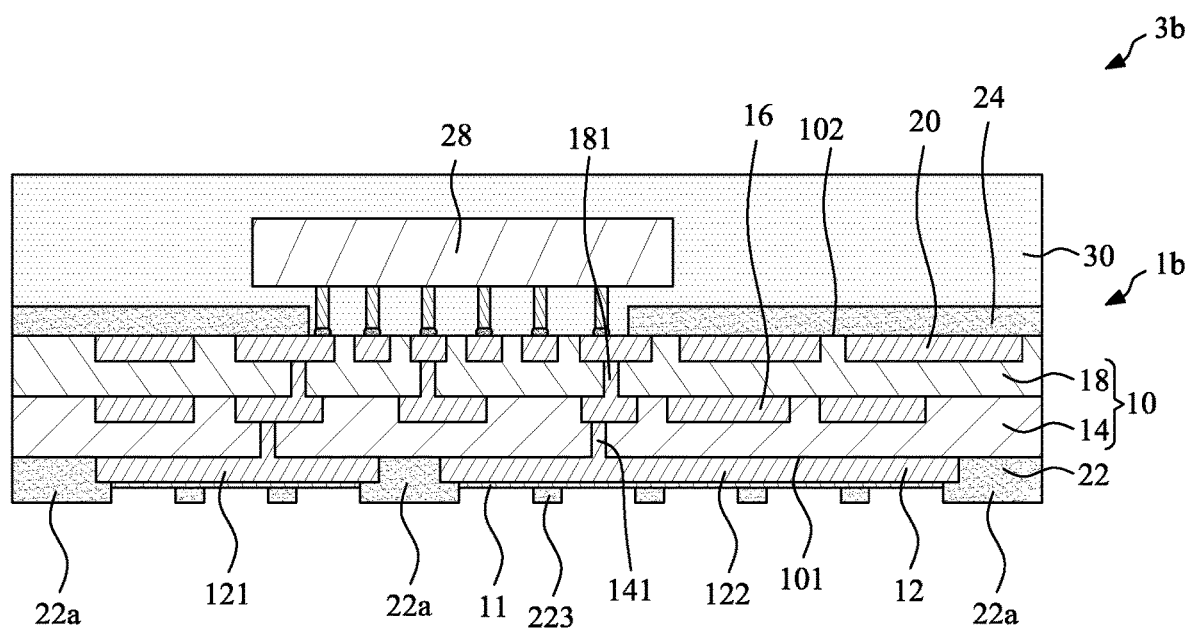
FIG. 11 illustrates a cross-sectional view of a semiconductor package structure according to some embodiments of the present disclosure.

FIG. 11 illustrates a cross-sectional view of a semiconductor package structure 3b according to some embodiments of the present disclosure. The semiconductor package structure 3b includes a substrate structure 1b, a semiconductor die 28 and an encapsulant 30. The substrate structure 1b of FIG. 11 is substantially the same as the substrate structure 1b of FIG. 6. The semiconductor die 28 is electrically connected to the top surface of the substrate structure 1b (e.g., the top surface 102 of the substrate body 10). As shown in FIG. 11, the semiconductor die 28 is electrically connected to the top circuit layer 20 by flip chip bonding, and is disposed in the imaginary die bonding area 26. The encapsulant 30, for example, molding compound, covers the semiconductor die 28, the top protection structure 24 of the substrate structure 1b and a portion of the top circuit layer 20 of the substrate structure 1b.

FIG. 12 through FIG. 18 illustrate a method for manufacturing a semiconductor package structure according to some embodiments of the present disclosure. In some embodiments, the method is for manufacturing the semiconductor package structures 3 shown in FIG. 9.

Figure 12:
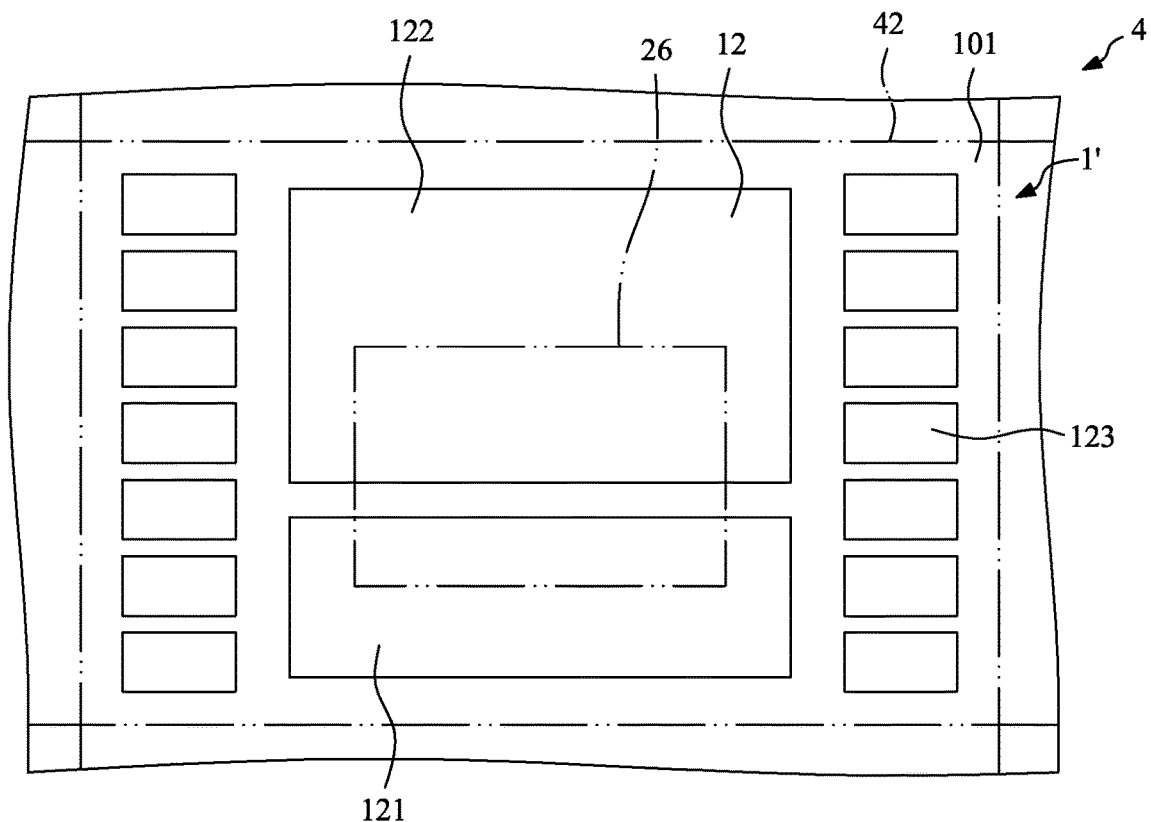
FIG. 12 illustrates one or more stages of an example of a method for manufacturing a semiconductor package structure according to some embodiments of the present disclosure.

Referring to FIG. 12, a substrate strip 4 is provided. The substrate strip 4 includes a plurality of substrate units P. The substrate units 1' are defined by a plurality of cutting lines 42. The substrate strip 4 may include a substrate body 10, a bottom circuit layer 12, a top circuit layer 20 and a plurality of imaginary die bonding areas 26. It is noted that FIG. 12 illustrates the bottom view of the substrate strip 4. The bottom circuit layer 12 is disposed on the bottom surface 101 of the substrate body 10, and may include a plurality of first pads (e.g., signal pads 123) and at least one second pad (e.g., at least one power pad 121 and at least one ground pad 122). An area of the second pad (e.g., the power pad 121 and/or the ground pad 122) is greater than an area of the first pad (e.g., signal pad 123) (e.g., may be about 3 or more times greater, about 5 or more times greater, about 10 or more times greater, or about 20 or more times greater).

Figure 13:
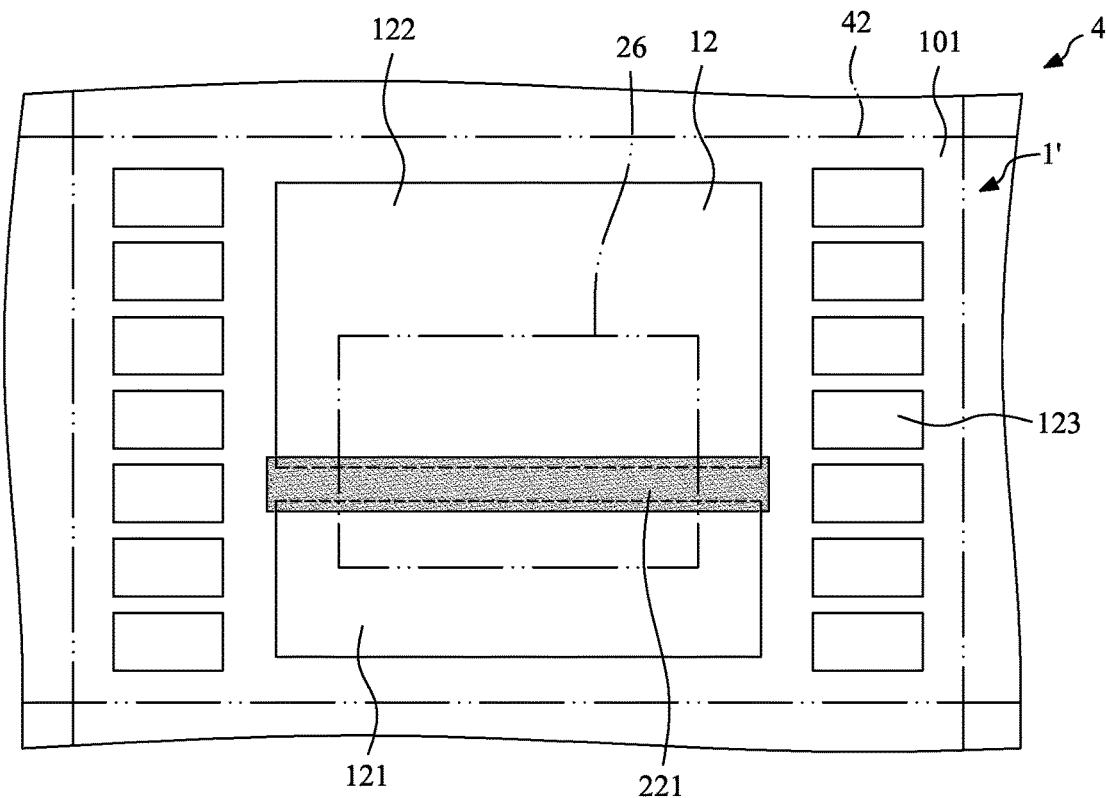
FIG. 13 illustrates one or more stages of an example of a method for manufacturing a semiconductor package structure according to some embodiments of the present disclosure.

Referring to FIG. 13, a first bottom protection structure 221 is formed or disposed on the bottom surface 101 of the substrate body 10, and covers a portion of the bottom circuit layer 12. The first bottom protection structure 221 is disposed between the power pad 121 and the ground pad 122, and covers a portion of the power pad 121 and a portion of the ground pad 122. A material of the first bottom protection structure 221 may include a solder mask or a solder resist material, such as, for example, benzocyclobutene (BCB) or polyimide.

Figure 14:
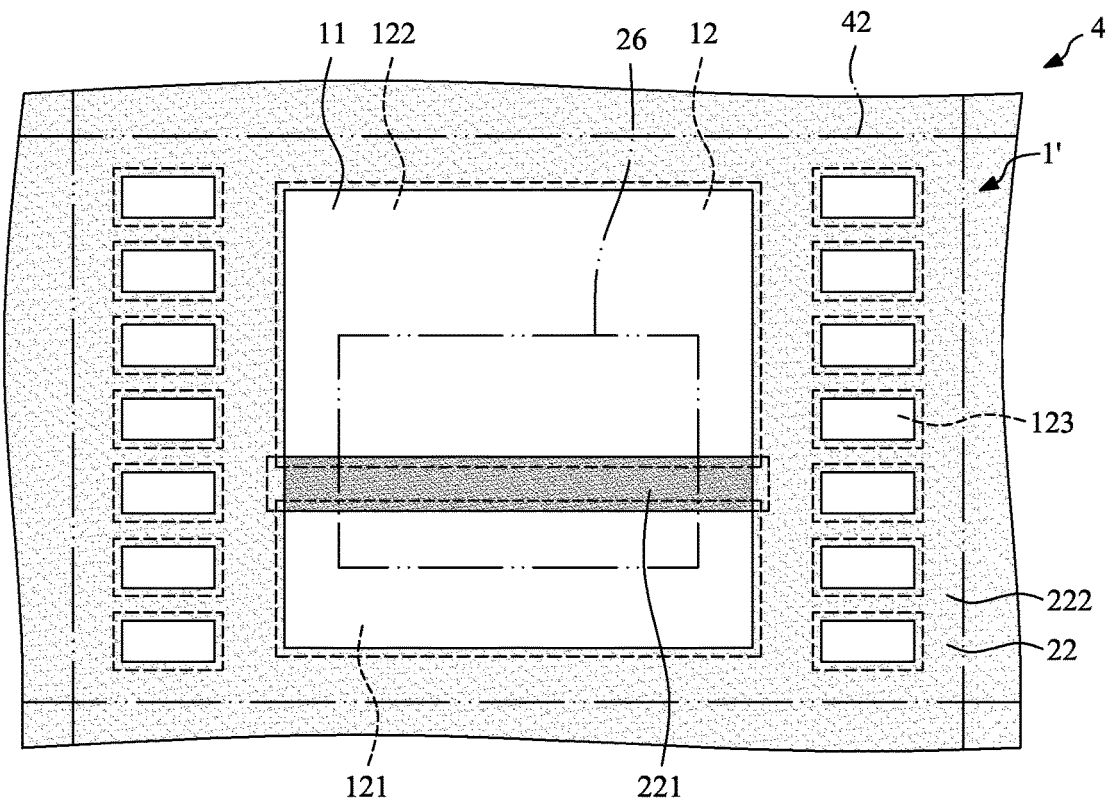
FIG. 14 illustrates one or more stages of an example of a method for manufacturing a semiconductor package structure according to some embodiments of the present disclosure.

Referring to FIG. 14, a second bottom protection structure 222 is formed or disposed at a periphery of the bottom surface 101 of the substrate body 10. Thus, the first bottom protection structure 221 is disposed within an area enclosed by the second bottom protection structure 222. The second bottom protection structure 222 covers a portion of the power pad 121, a portion of the ground pad 122 and a portion of the signal pad 123. Thus, the power pad 121 and the ground pad 122 are exposed from the first bottom protection structure 221 and the second bottom protection structure 222, and the signal pads 123 are exposed from the second bottom protection structure 222. A material of the second bottom protection structure 222 may include a solder mask or a solder resist material, such as, for example, benzocyclobutene (BCB) or polyimide. Then, a surface finish layer 11 (e.g., Ni/Au layer) is disposed or plated on the exposed power pad 121, the exposed ground pad 122 and the exposed signal pads 123.

Figure 15:
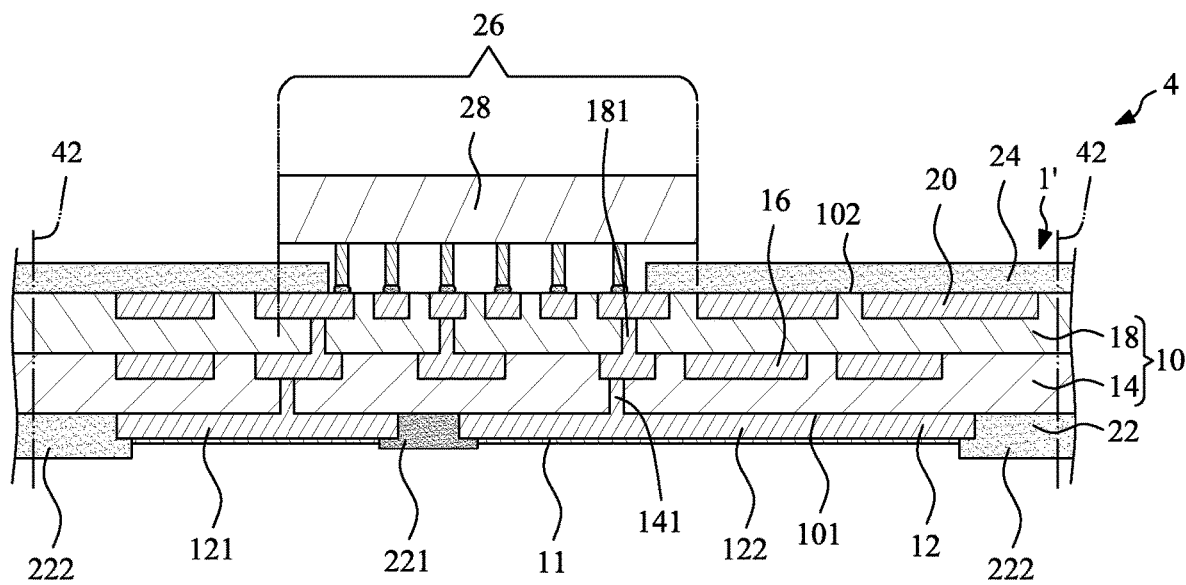
FIG. 15 illustrates one or more stages of an example of a method for manufacturing a semiconductor package structure according to some embodiments of the present disclosure.

Referring to FIG. 15, a plurality of semiconductor dice 28 are electrically connected to the top surface of the substrate strip 4 (e.g., the top surface 102 of the substrate body 10). As shown in FIG. 15, each of the semiconductor dice 28 is electrically connected to the top circuit layer 20 by flip chip bonding, and is disposed in the imaginary die bonding area 26.

Figure 16:
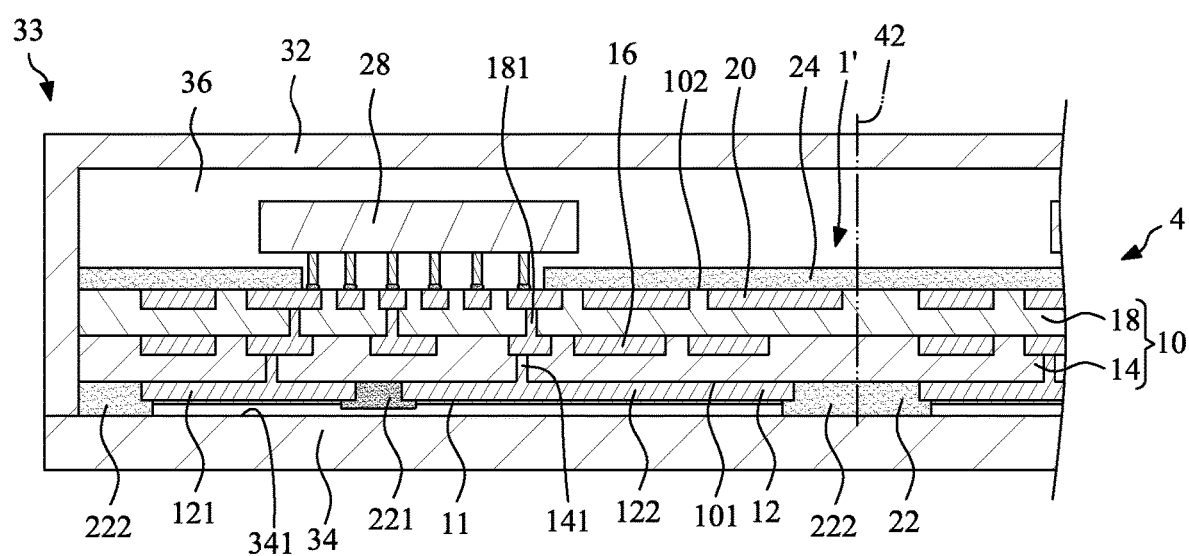
FIG. 16 illustrates one or more stages of an example of a method for manufacturing a semiconductor package structure according to some embodiments of the present disclosure.

Referring to FIG. 16, a mold chase 33 is provided. The mold chase 33 includes a top mold chase 32 and a bottom mold chase 34. The top mold chase 32 is attached to the bottom mold chase 34 to define a mold cavity 36. The bottom mold chase 34 has an inner top surface 341. The semiconductor dice 28 and the substrate strip 4 are disposed in the mold cavity 36 on the inner top surface 341 of the bottom mold chase 34. As shown in FIG. 16, the second bottom protection structure 222 of the bottom protection structure 22 contacts the inner top surface 341 of the bottom mold chase 34, whereas the first bottom protection structure 221 does not contact the inner top surface 341 of the bottom mold chase 34. That is, there is an empty space between the first bottom protection structure 221 and the inner top surface 341 of the bottom mold chase 34.

Figure 17:
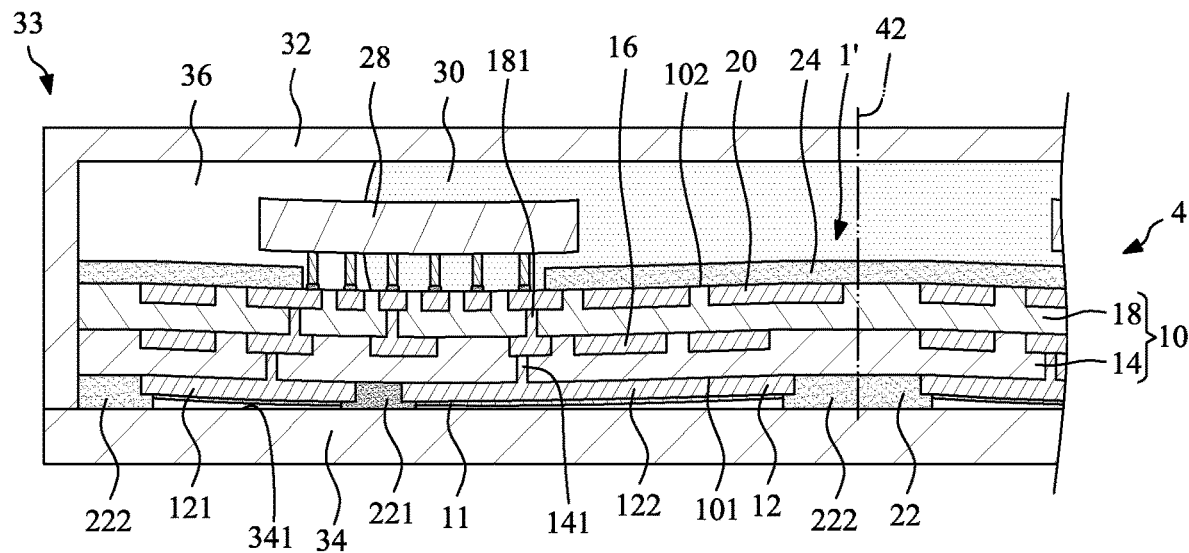
FIG. 17 illustrates one or more stages of an example of a method for manufacturing a semiconductor package structure according to some embodiments of the present disclosure.

Referring to FIG. 17, an encapsulant 30, for example, molding compound, is injected into the mold cavity 36 to cover the semiconductor die 28, the top protection structure 24 and a portion of the top circuit layer 20. Since the encapsulant 30 has a high pressure, the substrate strip 4 may be pressed to deform slightly until the first bottom protection structure 221 contacts the inner top surface 341 of the bottom mold chase 34. Thus, the semiconductor die 28 will not crack readily during the molding process. In a comparative embodiment, the second thickness $T_2$ of the second bottom protection structure 222 may be less than the first thickness $T_1$ of the first bottom protection structure 221, and the semiconductor die 28 may crack readily during the molding process.

Figure 18:
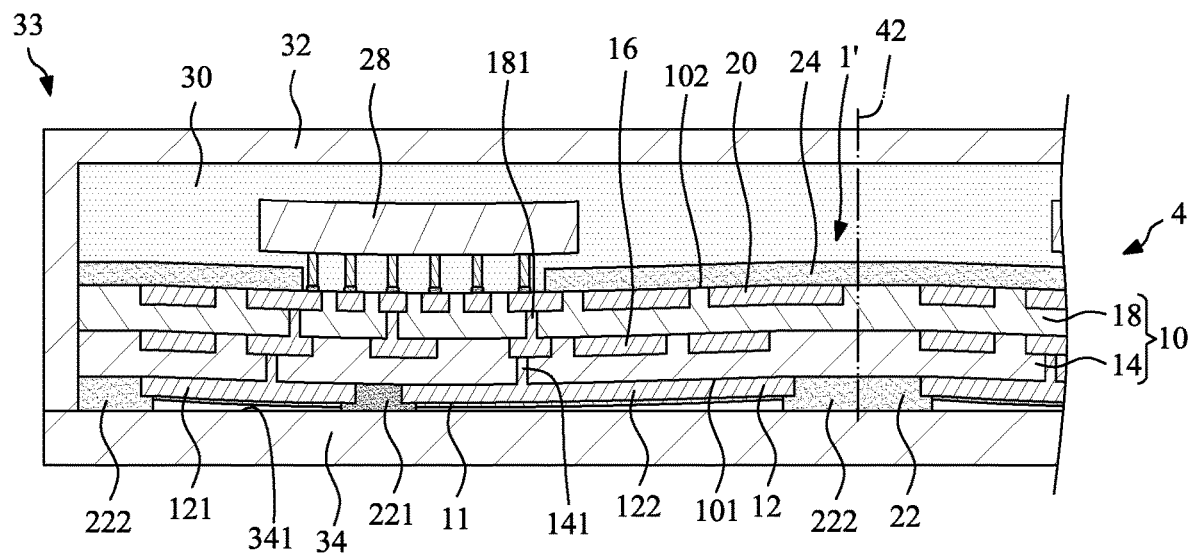
FIG. 18 illustrates one or more stages of an example of a method for manufacturing a semiconductor package structure according to some embodiments of the present disclosure.

Referring to FIG. 18, the encapsulant 30 fills the mold cavity 36, and then is cured to form a package structure. Then, the package structure is taken out form the mold cavity 36. Then, a singulation process is conducted along the cutting lines 42 to form a plurality of semiconductor package structures 3 as shown in FIG. 9.

In some embodiments, during a method for manufacturing the semiconductor package structures 3b shown in FIG. 11, the bottom surface of the bottom protection structure 22a is substantially coplanar with the bottom surface of the supporting pillar 223, thus, the bottom protection structure 22a and the supporting pillars 223 contact the inner top surface 341 of the bottom mold chase 34 simultaneously. Therefore, when the encapsulant 30 is injected into the mold cavity 36 to cover the semiconductor die 28, the top protection structure 24 and a portion of the top circuit layer 20, the substrate strip may not deform slightly as shown in FIG. 18. That is, the deformation of the substrate strip is improved.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   a substrate body having a top surface and a bottom surface opposite to the top surface;
   a bottom circuit layer disposed adjacent to the bottom surface of the substrate body, and including a plurality of pads;
   a first bottom protection structure disposed on the bottom surface of the substrate body, and covering a portion of the bottom circuit layer;
   a second bottom protection structure disposed on the bottom surface of the substrate body, and covering a portion of the bottom circuit layer, wherein a second thickness of the second bottom protection structure is greater than a first thickness of the first bottom protection structure, and
   an imaginary die bonding area disposed adjacent to the top surface of the substrate body,
   wherein the first bottom protection structure is disposed substantially under the imaginary die bonding area.

2. The substrate structure of claim 1, wherein there is a boundary between the second bottom protection structure and the first bottom protection structure.

3. The substrate structure of claim 2, wherein a gap between an edge of the first bottom protection structure projecting on the bottom surface of the substrate body and an edge of the imaginary die bonding area projecting on the bottom surface of the substrate body is less than 100 μm.

4. A substrate structure, comprising:
   a substrate body having a top surface and a bottom surface opposite to the top surface;
   a bottom circuit layer disposed adjacent to the bottom surface of the substrate body, and including a plurality of pads;
   a first bottom protection structure disposed on the bottom surface of the substrate body, and covering a portion of the bottom circuit layer;
   a second bottom protection structure disposed on the bottom surface of the substrate body, and covering a portion of the bottom circuit layer, wherein a second thickness of the second bottom protection structure is greater than a first thickness of the first bottom protection structure; and
   a top circuit layer disposed adjacent to the top surface of the substrate body, and electrically connected to the bottom circuit layer.

5. The substrate structure of claim 1, wherein the pads of the bottom circuit layer include at least one power pad, at least one ground pad and a plurality of signal pads, the first bottom protection structure is disposed between the power pad and the ground pad, and covers a portion of the power pad and a portion of the ground pad; the second bottom protection structure covers a portion of the signal pads.

6. The substrate structure of claim 1, wherein the second bottom protection structure is disposed at a periphery of the bottom surface of the substrate body.

7. The substrate structure of claim 6, wherein the first bottom protection structure is disposed within an area enclosed by the second bottom protection structure.

8. The substrate structure of claim 1, wherein the first thickness of the first bottom protection structure is defined as a gap between a bottom surface of the first bottom protection structure and a bottom surface of the bottom circuit layer, and the second thickness of the second bottom protection structure is defined as a gap between a bottom surface of the second bottom protection structure and the bottom surface of the bottom circuit layer.

9. The substrate structure of claim 1, wherein the second bottom protection structure covers a portion of the first bottom protection structure.

10. The substrate structure of claim 2, wherein the first bottom protection structure is disposed right under the imaginary die bonding area.

11. A semiconductor package structure, comprising:
    a substrate structure, comprising:
       a substrate body having a top surface and a bottom surface opposite to the top surface;
       a bottom circuit layer disposed adjacent to the bottom surface of the substrate body, and including a plurality of pads;
       a first bottom protection structure disposed on the bottom surface of the substrate body, and covering a portion of the bottom circuit layer, wherein the first bottom protection structure is disposed substantially under the die bonding area; and a second bottom protection structure disposed on the bottom surface of the substrate body, and covering a portion of the bottom circuit layer, wherein a second thickness of the second bottom protection structure is greater than a first thickness of the first bottom protection structure;

a semiconductor die electrically connected to the top surface of the substrate structure; and an encapsulant covering the semiconductor die and the substrate structure.

* * * * *